(12) United States Patent
Tozer

(10) Patent No.: US 9,179,580 B2
(45) Date of Patent: Nov. 3, 2015

(54) DATA CENTER COOLER WITH CHILLER AND COOLING TOWER

(75) Inventor: Robert Tozer, Kingston upon Thames Surrey (GB)

(73) Assignee: Hewlett-Packard Development Company, L.P., Houston, TX (US)

( * ) Notice: Subject to any disclaimer, the term of this patent is extended or adjusted under 35 U.S.C. 154(b) by 407 days.

(21) Appl. No.: 13/382,105

(22) PCT Filed: Jun. 10, 2010

(86) PCT No.: PCT/EP2010/058130
§ 371 (c)(1),
(2), (4) Date: Jan. 3, 2012

(87) PCT Pub. No.: WO2011/003692
PCT Pub. Date: Jan. 13, 2011

(65) Prior Publication Data
US 2012/0103591 A1    May 3, 2012

(30) Foreign Application Priority Data
Jul. 9, 2009   (GB) .................................. 0911868.8

(51) Int. Cl.
*H05K 7/20*   (2006.01)
*F25D 16/00*   (2006.01)
(Continued)

(52) U.S. Cl.
CPC ............ *H05K 7/20745* (2013.01); *F25D 16/00* (2013.01); *F25D 17/02* (2013.01); *F25B 25/005* (2013.01); *F25B 2600/13* (2013.01); *H05K 7/20281* (2013.01); *H05K 7/20836* (2013.01)

(58) Field of Classification Search
CPC ............ H05K 7/2029; H05K 7/20709; H05K 7/20763; H05K 7/208; H05K 7/20836; H05K 7/20281; F25D 17/02; F25B 25/005; F25B 2600/13
USPC ...................... 62/259.2, 434, 435; 165/104.33
See application file for complete search history.

(56) References Cited

U.S. PATENT DOCUMENTS

| | | | |
|---|---|---|---|
| 6,449,969 B1 * | 9/2002 | Fujimoto et al. | 62/180 |
| 7,028,768 B2 * | 4/2006 | Aler et al. | 165/219 |
| 7,791,882 B2 * | 9/2010 | Chu et al. | 361/698 |

(Continued)

FOREIGN PATENT DOCUMENTS

| | | |
|---|---|---|
| EP | 1134523 A1 | 9/2001 |
| EP | 1855070 A2 | 11/2007 |

OTHER PUBLICATIONS

International Search Report and Written Opinion for PCT Application No. PCT/EP2010/058130, European Intellectual Property Office, Nov. 2, 2010.

(Continued)

*Primary Examiner* — Marc Norman
*Assistant Examiner* — Max Snow
(74) *Attorney, Agent, or Firm* — International IP Law Group, PLLC

(57) ABSTRACT

The invention is a cooling module for one or more data centers. The cooling module accepts coolant from a data center, chills the coolant, then returns the coolant to the data center. The coolant is subject to cooling via a free cooling system and a then chiller. The chiller includes a bypass. The free cooling system and the chiller are fluidly connected in a second cooling loop that includes a dry cooling tower. A pump maintains pressure at a predetermined level.

19 Claims, 2 Drawing Sheets

(51) Int. Cl.
*F25D 17/02* (2006.01)
*F25B 25/00* (2006.01)

(56) References Cited

U.S. PATENT DOCUMENTS

| | | | |
|---|---|---|---|
| 7,864,530 B1 * | 1/2011 | Hamburgen et al. | 361/699 |
| 8,019,477 B2 * | 9/2011 | Bash et al. | 700/276 |
| 2003/0037919 A1 | 2/2003 | Okada et al. | |
| 2004/0000155 A1 * | 1/2004 | Cline et al. | 62/175 |
| 2005/0039904 A1 | 2/2005 | Aler et al. | |
| 2006/0075765 A1 * | 4/2006 | Huang et al. | 62/180 |
| 2007/0028632 A1 | 2/2007 | Liu | |
| 2007/0165377 A1 | 7/2007 | Rasmussen et al. | |
| 2008/0204999 A1 * | 8/2008 | Clidaras et al. | 361/696 |
| 2009/0223234 A1 * | 9/2009 | Campbell et al. | 62/127 |

OTHER PUBLICATIONS

International Search Report and Written Opinion for PCT Application No. PCT/EP2010/058130, European Intellectual Property Office. Nov. 2, 2010.

Office Action, GB0911868.8, HP reference 82249136, Jan. 5, 2012, 3 pps.

Office Action, GB0911868.8, HP reference 82249136, Oct. 23, 2009, 5 pps.

Office Action, GB0911868.8, HP reference 83349136, Sep. 7, 2011, 5 pps.

* cited by examiner

DATA CENTER COOLER WITH CHILLER AND COOLING TOWER

CLAIM FOR PRIORITY

The present application is a national stage filing under 35 U.S.C 371 of PCT application number PCT/EP2010/058130, having an international filing date of Jun. 10, 2010, which is incorporated by reference in its entirety.

BACKGROUND

For various economic and business reasons enterprises are increasingly centralizing their backend computer systems in purpose built data centers. Data centers typically house high concentrations and densities of such computer systems and additionally provide facilities such as uninterruptible power supplies and cooling systems necessary for the operation of the computer systems in the data center.

Different data centers are typically unique in their requirements and capacity, since the requirements of data centre customers are highly individual. Accordingly, the cooling requirements of data centers are also highly individual and must be carefully designed to provide an appropriate amount of cooling for their associated data center.

However, designing and building custom cooling facilities is a complex, time-consuming and expensive task. Furthermore, as data center requirements change over time, for example through the addition of extra computing capacity, corresponding changes may be required to the cooling facilities.

SUMMARY

According to one embodiment, there is provided cooling apparatus comprising an outlet for supplying chilled liquid, an inlet for receiving return chilled liquid, a free cooling system for providing first cooling the return chilled liquid, a chiller unit for further cooling the first cooled return liquid to a predetermined temperature, a pressure difference sensor for measuring the pressure difference between the chilled liquid supplied at the outlet and the return liquid received at the inlet, and a flow control module for maintaining a predetermined pressure difference between the liquid supplied at the outlet and the return liquid received at the inlet.

BRIEF DESCRIPTION

Embodiments of the invention will now be described, by way of non-limiting example only, with reference to the accompanying drawings, in which.

DETAILED DESCRIPTION

Figure 1:
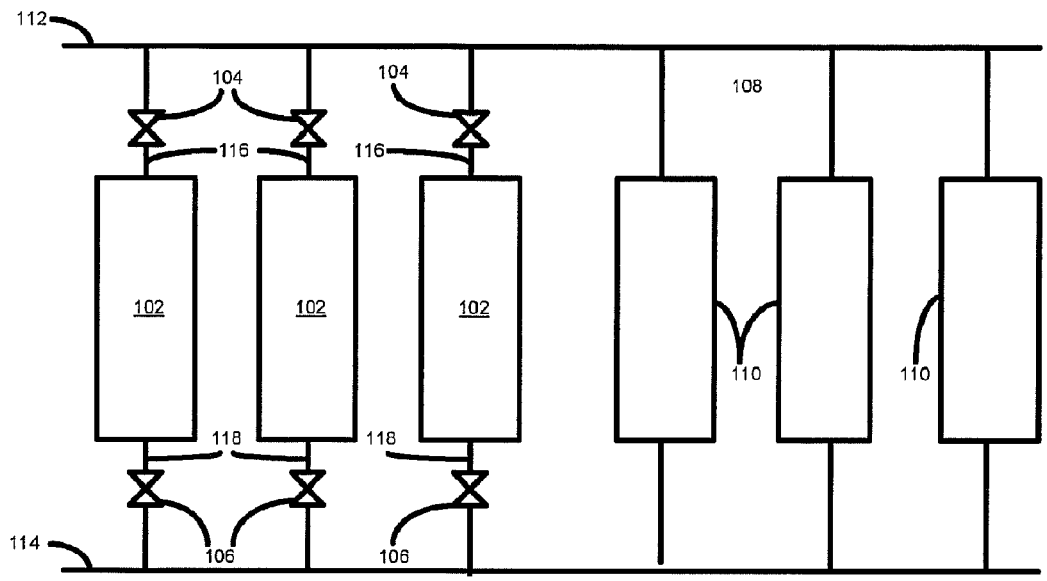
FIG. 1 is a block diagram showing an overview of a data center according to one embodiment of the present invention.

Referring now to FIG. 1, there is shown an overview of a facility 100 according to an embodiment of the present invention.

The facility 100 comprises a number of data center modules 110. In one embodiment each data center module is a containerized data center module housed, for example, in any suitable transportable container such as an Intermodal Transport Unit (ITU), shipping container, POD (portable on demand), or the like. In a further embodiment one or more of the data center modules may be a 'bricks and mortar' data center.

Each of the data center modules 110 house internal cooling equipment, such as computer room air handling (GRAN) units, and air handling units (AHU), that require a supply of chilled liquid, such as chilled water, in order to operate.

To supply chilled water to the data center modules 110, one or more cooling modules 102 are provided. The cooling modules 102 may, for example, be housed in a transportable container, such as an ITU, a POD, a shipping container, or the like.

Each cooling module 102 has a chilled water supply outlet 116 and a warmed chilled water return inlet 118 which are connected to distribution pipework 112 and 114 respectively. Each data center module 102 is removably connected to the distribution pipework 112 and 114 through isolation valves 104 and 106.

Cooling equipment, such as CRAHs and AHUs, within each data center module 110 is also removably connected to the distribution pipework 112 and 114.

In this way, chilled water provided from the outlets 116 of the cooling modules 102 is provided to cool the internal cooling equipment of each data center module 110. Warmed return chilled water is returned to the cooling modules 102 through return inlets 118.

Each cooling module 102 provides up to a predetermined cooling capacity and is factory tested and configured to supply chilled water against a predetermined external differential pressure. The pressure difference between the inlets and outlets of each cooling module may be set individually to ensure that all cooling loads in the data centre may be met. In this way, each cooling module 102 provides a variable flow of chilled water to the distribution pipework 112. The cooling modules 102 are described in further detail below.

In one embodiment, the cooling modules 102 are configured to supply a variable flow of chilled water at a substantially constant supply temperature. In a further embodiment, the cooling modules 102 are configured to supply a variable flow of chilled water at a substantially constant return temperature.

Advantageously, by providing modular cooling modules 102 the design and implementation of a data center cooling system can be substantially simplified. For example, when the data center 100 is designed, the cooling requirements of the initial design can be determined and one or more cooling modules 102 can be included in the data center to provide an appropriate amount of cooling. This avoids the need to design from scratch a 'bricks and mortar' type custom built chilled water system. Additionally, since the cooling modules 102 provide a variable flow of chilled water, the cooling modules 102 provide only the amount of chilled water required by the cooling systems of the data center modules.

Furthermore, if the cooling requirements of the data center change overtime, for example, through the addition or removal of computing equipment, cooling modules may be added or removed from the data center in a simple manner. Additionally, since each cooling module is factory tested, installation of such a module is greatly simplified, requiring little more than connection to the distribution pipework 112 and 114, an appropriate power supply, and a water supply. If applicable, connection may also be made to an evaporative cooling plant, such as adiabatic coolers and cooling towers.

Yet further, the cooling modules 102 are configured to use free cooling when ambient conditions allow thereby increasing their energy efficiency.

Figure 2:
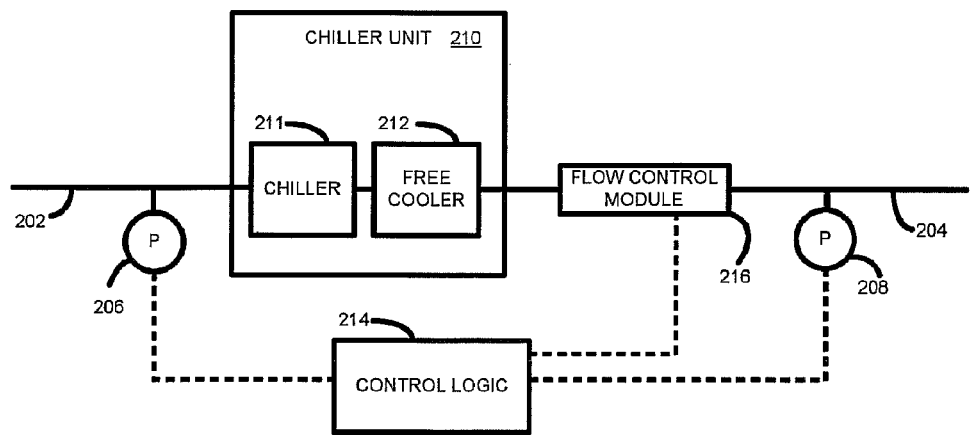
FIG. 2 is a block diagram showing a simplified overview of a cooling module according an embodiment of the present invention.

FIG. 2 shows a simplified block diagram of a cooling module 200 according to an embodiment of the present invention. In the accompanying drawings solid connecting lines are used to represent pipework and dashed connecting lines are used to represent control signals.

The cooling module 200 has an outlet 202 which supplies chilled water and an inlet 204 which receives warmed return chilled water. The warmed return chilled water is chilled water that has been warmed, for example, during the creation of cooled air, such as by mechanical air conditioning units. The warmed return chilled water is fed through a chiller unit 210 that cools the warmed return chilled water to a desired temperature.

The chiller unit 210 comprises a free cooling module 212 for cooling the return water through non-mechanical chilling means such as heat exchangers. The chiller unit 210 also includes a mechanical chiller 211, such as a refrigeration loop, for further chilling the cooled return water when free cooler module 212 is unable to cool the return water to the desired temperature. In one embodiment, the mechanical chiller unit 211 is configured to cool the warmed return chilled water by 5 to 10 degrees, although those skilled in the art will appreciate that in other embodiments a greater or lesser degree of cooling may be obtained to meet specific requirements.

In alternative embodiments, the non-mechanical and mechanical chilling means are used in parallel, so that the system can operate either with mechanical cooling, free cooling, or both mechanical and free cooling.

The cooling module 200 additionally includes a pressure sensor 206 for measuring the outlet water pressure at, or in close proximity to, the outlet 202. A further pressure sensor 208 is provided for measuring the return water pressure at, or in close proximity to, the return inlet 204. A control logic module 214 obtains the two pressure measurements and determines the pressure differential between the inlet and outlet pressures. The control logic 214 controls a flow control module 216 to maintain a predetermined pressure differential between the inlet 202 and outlet 204. Additionally, a pressurization module (not shown) may used to maintain a liquid pressure above atmospheric pressure, to prevent cavitation within the flow control module 216. The flow control module may comprise, for example, one or more variable speed pumps.

One advantage this arrangement brings about is that all the control loops and cabling are contained within the chilled water supply module, thereby avoiding having connections and wiring further down the chilled water distribution system. This increases the modularity of the cooling module 200.

Figure 3:
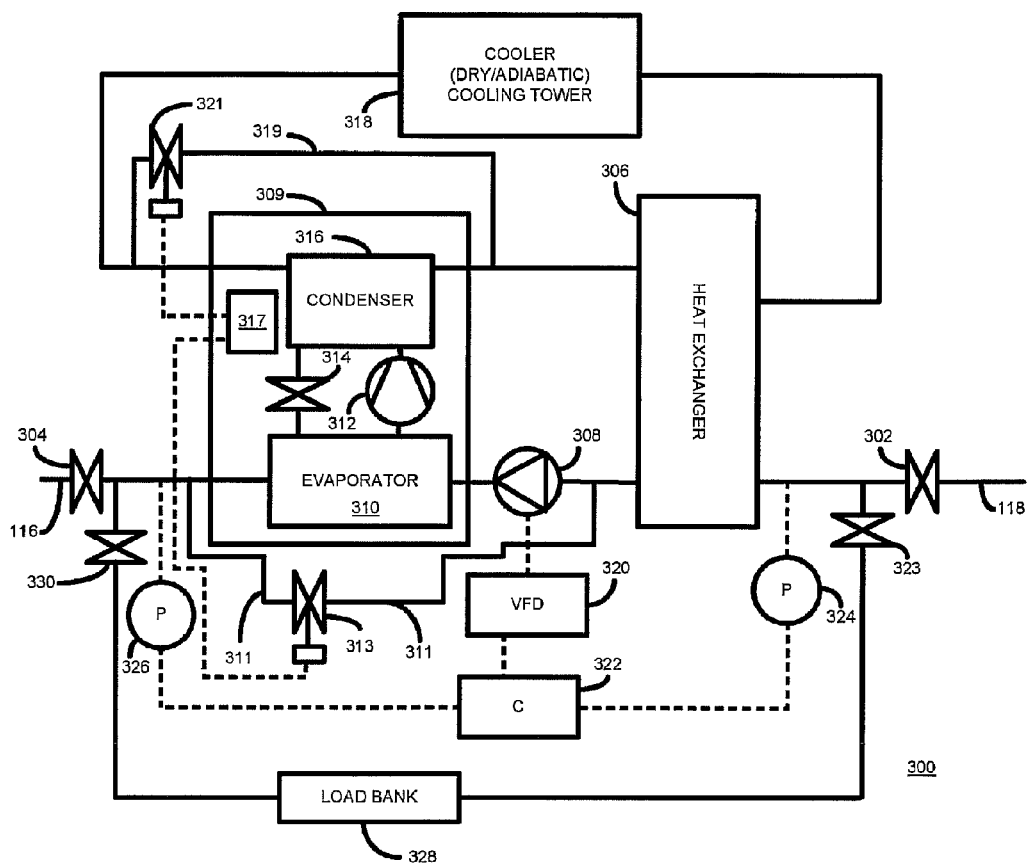
FIG. 3 is a block diagram of a modular cooling system according to an embodiment of the present invention.

Referring now to FIG. 3, there is shown a more detailed view of a modular cooling module 300 according to one embodiment of the present invention.

The cooling module 300 has a chilled water outlet 116 through which chilled water is output, and a return inlet 118 through which warmed chilled water is returned to the cooling module. The outlet 116 and inlet 118 are connected respectively to isolating valves 304 and 302. These valves enable the cooling module 300 to be isolated and transported with ease, and enable quick and easy connection within a facility 100 such as a data center.

Warmed return chilled water is received at inlet 118 from, for example, a data center module 110. The warmed return chilled water passes through a heat exchanger 306, such as a plate heat exchanger. The heat exchanger 306 is arranged to cool the warmed return chilled water through free cooling. The cooled chilled water is then pumped, by pump 308, through a chiller unit 309. The pump 308 is used to ensure a predetermined differential pressure, as previously described. The chiller unit 309 is comprised of an evaporator 310, a condenser 316, a compressor 312, an expansion device 314, and control logic 317. The control logic is configured so the chiller unit 309 outputs water at a substantially constant predetermined or programmed temperature.

Depending on the temperature of the water cooled by the heat exchanger, the chiller unit 9 may or may not need to function, or may need to function partially at a reduced part load. For the purposes of this example, assume that the cooling module 300 is configured to supply chilled water at 15 degrees Celsius. If warmed return chilled water is input to the heat exchanger at 20 degrees Celsius, and is cooled by the heat exchanger, through free cooling, to 15 degrees Celsius no further mechanical cooling of the water is required. In this case, the chiller unit control logic 317 may stop or reduce the functioning of the chiller unit.

If, however, the heat exchanger is only able to cool the water to, say, 17 degrees Celsius, for example if the return water is at a higher temperature or if ambient conditions do not allow for sufficient free cooling of the return water, the chiller unit control logic 317 controls the operation of the chiller unit 309 to provide the water output from the chiller unit 309 at the predetermined temperature. Such control may be achieved, for example, in any suitable manner, such as by controlling the compressor 312 speed, inlet guide vanes, control valves, cycle time, etc.

The condenser water warmed by the heat exchanger 306 is cooled using, for example, a dry/adiabatic cooler or cooling tower 318.

A condenser water bypass 319 is provided to allow water from the output of the condenser 316 to be fed back to the input of the condenser 316 or to bypass it to avoid problems with the condenser temperature becoming too low. The opening and closing of the condenser water bypass 319 is controlled by an automatic valve 321, controlled by the chiller control logic 317.

To ensure that the chilled water supplied at outlet 116 is supplied at a constant differential pressure, pressure gauges 326 and 324 are provided. Pressure gauge 324 measures the pressure of the return chilled water at, or in close proximity to, inlet 118, and pressure gauge 326 measures the pressure of the chilled water at, or in close proximity to, outlet 116. Based on the measured inlet and outlet pressures the controller 322 ensures that an adequate pressure difference is maintained between the returned water and the chilled water output by controlling the speed of the pump 308, through a variable frequency drive module 320. By ensuring an adequate pressure difference ensures that the chilled water supplied by the cooling module 300 is able to circulate in distribution pipework 112 and 114 of a data center 100, whilst ensuring correct operation of any other cooling modules present in the data center. Typical differential pressures may be in the range from approximately 100 kPa to 500 kPa, although this may be varied depending on specific circumstances. The pressure differential is controlled to avoid problems of pump cavitation at low pressures and to keep the pressures below maximum design pressures of the facility.

An evaporator bypass 311 is provided to allow the chiller unit 309 to operate below its minimum flow rate, for example with low cooling loads. The chiller unit 309 will normally have its own differential pressure controller across the evaporator to ensure its minimum flow rate is satisfied. Below this minimum flow rate it will disable the chiller. The bypass 311 bypasses chilled water from the chiller unit 309 back to the input of the chiller unit 309. The evaporator bypass 311 is controlled through an automatic valve 313 controlled by controller 317.

When assembling the cooling module 300 factory testing is performed to ensure that the cooling module 300 is able to provide the required amount of cooling and that all its control functions operate correctly. Testing is achieved using a load bank 328 that is detachably connected to the outlet 116 and inlet 118. When the load bank 328 is present, the valves 304 and 302 are shut and the valves 330 and 232 are opened.

The load bank 328 may be any suitable heat source, such as a boiler, used for generating a predetermined amount of heat for heating up chilled water output from the cooling module 300. The load bank 328 may also reduce the pressure of the supplied chilled water, to simulate the pressure reduction experienced in a typical data center 100. In this way, the cooling module 300 can be fully configured and tested to ensure correct operation over a wide range of conditions.

Once the correct operation of the cooling module 300 has been verified, the load bank 328 may be removed from the cooling module 300, and the cooling module 300 is then ready to be installed and used in a data center, such as data center 100.

In a further embodiment, the cooling module 300 is configured to provide return water at a substantially constant temperature. This may be achieved, for example, by monitoring to the temperature of the return water and by adjusting the output temperature of the chiller unit 309 in accordance therewith, such that the return water is at a substantially constant temperature. One advantage of maintaining a substantially constant return water temperature is that the chilled water temperature may be raised, depending on the current cooling load, leading to potentially large energy savings.

Those skilled in the art will appreciate that reference made herein to water and water cooling systems is not limited thereto, and that any other suitable liquids, such as brines (i.e. glycol/water), refrigerants (i.e. carbon dioxide, etc), may alternatively be used.

Those skilled in the art will also appreciate that reference herein to data centers may include any other types of facilities having cooling requirements, such as power plants, mechanical installations, and the like.

The invention claimed is:

1. A cooling apparatus, comprising:
   an outlet that supplies a chilled liquid to a data center;
   an inlet that receives return chilled liquid from the data center;
   a heat exchanger arranged downstream of the inlet that provides first cooling to the return chilled liquid;
   a chiller unit with an evaporator and a condenser, the evaporator arranged downstream of the heat exchanger with respect to the chilled liquid flow, the chiller unit configured to further cool the return chilled liquid to a predetermined temperature;
   a pressure difference sensor that measures a pressure difference between the chilled liquid supplied at the outlet and the return chilled liquid received at the inlet;
   a pump coupled between the heat exchanger and the evaporator that is configured to maintain a predetermined pressure difference between the chilled liquid supplied at the outlet and the return chilled liquid received at the inlet;
   a bypass line that connects the outlet of the evaporator to the inlet of the pump;
   control logic that is configured to control the chiller unit such that the return chilled liquid exiting the chiller unit is maintained at the predetermined temperature; and
   a liquid cooling loop that circulates a coolant; said cooling loop connecting the heat exchanger, the condenser, and a dry cooling tower in series; said cooling loop further comprising a bypass line arranged in parallel to the condenser.

2. The cooling apparatus of claim 1, wherein the pressure difference sensor further comprises:
   a pressure sensor in proximity to the inlet;
   a pressure sensor in proximity to the outlet; and
   control logic that determines the pressure difference, the control logic being configured to control the pump to maintain the predetermined pressure difference.

3. The cooling apparatus of claim 1 wherein the chiller unit is only operated when it is determined that a temperature of the first cooled return chilled liquid is above the predetermined temperature.

4. The cooling apparatus of claim 1, wherein the cooling apparatus is configured to supply a variable amount of the chilled liquid at a constant supply temperature.

5. The cooling apparatus of claim 1, wherein the cooling apparatus is configured to supply a variable amount of the chilled liquid at a constant return temperature.

6. The cooling apparatus of claim 1, wherein the chilled liquid is any one of water, brine, or refrigerant.

7. A facility comprising:
   one or more data center modules, each data center module having one or more cooling elements requiring a supply of a chilled liquid through a distribution pipework; and
   one or more modular cooling modules removably connected to the distribution pipework,
   wherein each of the one or more modular cooling modules comprises:
   an outlet that supplies a chilled liquid to at least one data center module;
   an inlet that receives return chilled liquid from the at least one data center module;
   a heat exchanger arranged downstream of the inlet that provides first cooling to the return chilled liquid;
   a chiller unit with an evaporator and a condenser, the evaporator arranged downstream of the heat exchanger with respect to the chilled liquid flow, the chiller unit configured to further cool the return chilled liquid to a predetermined temperature;
   a pressure difference sensor that measures a pressure difference between the chilled liquid supplied at the outlet and the return chilled liquid received at the inlet;
   a pump coupled between the heat exchanger and the evaporator that is configured to maintain a predetermined pressure difference between the chilled liquid supplied at the outlet and the return chilled liquid received at the inlet;
   a bypass line that connects the outlet of the evaporator to the inlet of the pump;
   control logic that is configured to control the chiller unit such that the return chilled liquid exiting the chiller unit is maintained at the predetermined temperature; and
   a liquid cooling loop that circulates a coolant; said cooling loop connecting the heat exchanger, the condenser, and a dry cooling tower in series; said cooling loop further comprising a bypass line arranged in parallel to the condenser.

8. The facility of claim 7, wherein:
   the distribution pipework includes a first isolation valve and a second isolation valve;

the outlet is removably connectable to the first isolation valve; and the inlet is removably connectable to the second isolation valve.

9. The facility of claim 7, wherein the predetermined pressure difference is set individually for each of the one or more modular cooling modules.

10. The facility of claim 7, wherein:

the evaporator bypass comprises a valve controlled by a controller.

11. The cooling apparatus of claim 1, wherein the condenser bypass line feeds the further cooled return chilled liquid back to the input of the condenser; or bypasses the input of the condenser when a temperature of the condenser is below a predetermined temperature.

12. The cooling apparatus of claim 1, wherein the predetermined temperature is based on a current cooling load.

13. The facility of claim 1, wherein the predetermined temperature is based on a current cooling load.

14. A method of cooling a data center comprising:

supplying a chilled liquid to a data center via an outlet;

receiving return chilled liquid from the data center via an inlet;

providing first cooling to the return chilled liquid via a heat exchanger arranged downstream of the inlet;

providing second cooling to the return chilled liquid via a chiller unit that comprises an evaporator and a condenser, the evaporator arranged downstream of the heat exchanger with respect to the chilled liquid flow, the second cooling chilling the return chilled liquid to a predetermined temperature;

measuring a pressure difference between the chilled liquid supplied at the outlet and the return chilled liquid received at the inlet with a pressure difference sensor;

pumping the chilled liquid with a pump coupled between the heat exchanger and the evaporator;

maintaining a predetermined pressure difference between the chilled liquid supplied at the outlet and the return chilled liquid received at the inlet by controlling the pump;

controlling a bypass line that connects the outlet of the evaporator to the inlet of the pump;

maintaining the return chilled liquid at the predetermined temperature with the application of preconfigured control logic;

circulating a coolant in a liquid cooling loop that connects the heat exchanger, the condenser, and a dry cooling tower in series;

controlling a coolant bypass line arranged in parallel to the condenser.

15. The method of claim 14, wherein the pressure difference sensor comprises:

a pressure sensor in proximity to the inlet;

a pressure sensor in proximity to the outlet; and control logic that determines the pressure difference, the control logic being configured to control the pump to maintain the predetermined pressure difference.

16. The method of claim 14, wherein the chiller unit is only operated when it is determined that a temperature of the first cooled return chilled liquid is above the predetermined temperature.

17. The method of claim 14, further comprising supplying a variable amount of the chilled liquid at a constant supply temperature.

18. The cooling apparatus of claim 14, further comprising feeding a variable amount of the chilled liquid at a constant return temperature.

19. The method of claim 14, wherein the chilled liquid is any one of water, brine, or refrigerant.

* * * * *

UNITED STATES PATENT AND TRADEMARK OFFICE
CERTIFICATE OF CORRECTION

PATENT NO. : 9,179,580 B2
APPLICATION NO. : 13/382105
DATED : November 3, 2015
INVENTOR(S) : Robert Tozer et al.

It is certified that error appears in the above-identified patent and that said Letters Patent is hereby corrected as shown below:

Claims

In column 7, line 19 approx., in Claim 13, delete "claim 1," and insert -- claim 7, --, therefor.

Signed and Sealed this
Third Day of May, 2016

Michelle K. Lee
*Director of the United States Patent and Trademark Office*